(12) United States Patent
Mangrum et al.

(10) Patent No.: US 7,807,511 B2
(45) Date of Patent: Oct. 5, 2010

(54) METHOD OF PACKAGING A DEVICE HAVING A MULTI-CONTACT ELASTOMER CONNECTOR CONTACT AREA AND DEVICE THEREOF

(75) Inventors: Marc A. Mangrum, Manchaca, TX (US); Kenneth R. Burch, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 526 days.

(21) Appl. No.: 11/561,234

(22) Filed: Nov. 17, 2006

(65) Prior Publication Data

US 2008/0116573 A1    May 22, 2008

(51) Int. Cl.
*H01L 21/00* (2006.01)

(52) U.S. Cl. .............................. 438/127; 257/E21.499; 174/521

(58) Field of Classification Search .................. 438/106, 438/112, 126, 127; 174/521; 257/E21.499
See application file for complete search history.

(56) References Cited

U.S. PATENT DOCUMENTS

| | | | |
|---|---|---|---|
| 4,088,546 A | 5/1978 | Wu et al. |
| 4,866,501 A | 9/1989 | Shanefield |
| 5,250,843 A | 10/1993 | Eichelberger |
| 5,438,877 A | 8/1995 | Vowles et al. |
| 5,497,033 A | 3/1996 | Fillion et al. |
| 5,746,307 A | 5/1998 | Joss et al. |
| 5,948,533 A | 9/1999 | Gallagher et al. |
| 5,977,826 A | 11/1999 | Behan et al. |
| 6,148,673 A | 11/2000 | Brown |
| 6,254,815 B1 | 7/2001 | Cheperak |
| 6,271,060 B1 | 8/2001 | Zandman et al. |
| 6,287,256 B1 | 9/2001 | Park et al. |
| 6,307,282 B1 | 10/2001 | Yu et al. |
| 6,316,287 B1 | 11/2001 | Zandman et al. |
| 6,346,742 B1 | 2/2002 | Bryzek et al. |
| 6,350,623 B1 | 2/2002 | Scherer et al. |
| 6,392,257 B1 | 5/2002 | Ramdani et al. |

(Continued)

FOREIGN PATENT DOCUMENTS

CN    2534677    2/2003

OTHER PUBLICATIONS

International Search Report and Written Opinion, Jan. 24, 2008.

(Continued)

*Primary Examiner*—W. David Coleman
(74) *Attorney, Agent, or Firm*—Kim-Marie Vo; James L. Clingan, Jr.

(57) ABSTRACT

Forming a packaged device having a semiconductor device having a first major surface and a second major surface includes forming an encapsulating layer over the second major surface of the semiconductor device and around sides of the semiconductor device and leaving the first major surface of the first semiconductor device exposed. A first insulating layer is formed over the first major surface. A plurality of vias are formed in the first insulating layer. A plurality of contacts are formed to the semiconductor device through the first plurality of vias, wherein each of the plurality of contacts has a surface above the first insulating layer. A supporting layer is formed over the first insulating layer leaving an opening over the first plurality of contacts wherein the opening has a sidewall surrounding the plurality of contacts.

16 Claims, 8 Drawing Sheets

U.S. PATENT DOCUMENTS

| | | | |
|---|---|---|---|
| 6,400,573 B1 | 6/2002 | Mowatt et al. | |
| 6,401,545 B1 | 6/2002 | Monk et al. | |
| 6,407,929 B1 | 6/2002 | Hale et al. | |
| 6,441,753 B1 | 8/2002 | Montgomery | |
| 6,562,647 B2 | 5/2003 | Zandman et al. | |
| 6,586,836 B1 | 7/2003 | Ma et al. | |
| 6,628,526 B1 | 9/2003 | Oshima et al. | |
| 6,655,023 B1 | 12/2003 | Eldridge et al. | |
| 6,707,124 B2 | 3/2004 | Wachtler et al. | |
| 6,797,145 B2 | 9/2004 | Kosowsky | |
| 6,825,552 B2 | 11/2004 | Light et al. | |
| 6,838,776 B2 | 1/2005 | Leal et al. | |
| 6,859,657 B1 | 2/2005 | Barnard | |
| 6,869,870 B2 | 3/2005 | Lin | |
| 6,876,061 B2 | 4/2005 | Zandman et al. | |
| 6,921,860 B2 | 7/2005 | Peterson et al. | |
| 6,921,975 B2 | 7/2005 | Leal et al. | |
| 6,952,055 B2 | 10/2005 | Scherer et al. | |
| 6,978,160 B2 | 12/2005 | Hutchison et al. | |
| 7,004,702 B2 | 2/2006 | Van Der Heijden | |
| 7,015,075 B2 | 3/2006 | Fay et al. | |
| 7,053,799 B2 | 5/2006 | Yu et al. | |
| 7,498,196 B2 * | 3/2009 | Lee et al. | 438/108 |
| 2002/0031950 A1 | 3/2002 | Doutrich et al. | |
| 2003/0077871 A1 | 4/2003 | Cheng et al. | |
| 2004/0009683 A1 | 1/2004 | Hiroka et al. | |
| 2004/0207077 A1 | 10/2004 | Leal et al. | |
| 2005/0056531 A1 | 3/2005 | Yu et al. | |
| 2005/0056551 A1 | 3/2005 | White et al. | |
| 2005/0158912 A1 | 7/2005 | Moden et al. | |
| 2005/0176174 A1 | 8/2005 | Leedy | |
| 2005/0194669 A1 | 9/2005 | Kim et al. | |
| 2005/0242425 A1 | 11/2005 | Leal et al. | |
| 2006/0146027 A1 | 7/2006 | Tracy et al. | |
| 2006/0154496 A1 | 7/2006 | Imamura et al. | |
| 2006/0157852 A1 | 7/2006 | Hsu et al. | |
| 2006/0263930 A1 | 11/2006 | Ito | |
| 2007/0158787 A1 | 7/2007 | Chanchani | |
| 2008/0085572 A1 | 4/2008 | Yang et al. | |
| 2008/0119004 A1 * | 5/2008 | Burch et al. | 438/51 |

OTHER PUBLICATIONS

Freescale Semiconductor, Inc., Redistributed Chip Package (RCP) Technology, 6 pages, 2005.
Densitron Technologies website www.densitron.com/displays/products/inter.html, Oct. 15, 2006.
Tyco Electronics website—Elastomeric Technologies—www.macrovis.com/images/ETI-Bro.pdf, Nov. 2006.
John R. Morris, AT&T Bell Laboratories Engineering Research Center, Princeton, NJ, "Interconnection and Assembly of LCDs", AMLCDs 1995, pp. 66-71.
International Search Report and Written Opinion correlating to PCT/US07/79714, SC10407TK, dated Mar. 27, 2008.
International Search Report and Written Opinion correlating to PCT/US2007/080523, MT10361TK, dated May 15, 2008.
International Search Report and Written Opinion correlating to PCT/US07/79722, MT10287TK, dated Mar. 27, 2008.
Snaptron website, http://www.snaptron.com, May 10, 2008.
USPTO Office Action regarding related U.S. Appl. No. 11/561,232 (MT10285TK), Restriction dated Mar. 13, 2009.
USPTO Office Action regarding related U.S. Appl. No. 11/561,232 (MT10285TK), Non-Final Rejection dated May 13, 2009.
USPTO Office Action regarding related U.S. Appl. No. 11/561,211 (MT10287TK), Non-Final Rejection dated May 30, 2008.
USPTO Office Action regarding related U.S. Appl. No. 11/561,211 (MT10287TK), Rejection-Final-Dec. 26, 2008.
USPTO Office Action regarding related U.S. Appl. No. 11/561,241 (MT10361TK), Notice of Allowance dated Sep. 17, 2008.
USPTO Office Action regarding related U.S. Appl. No. 11/561,241 (MT10361TK), Notice of Allowance dated Jul. 30, 2008.
USPTO Office Action regarding related U.S. Appl. No. 11/561,063 (MT10407TK), Restriction dated Sep. 9, 2008.
USPTO Office Action regarding related U.S. Appl. No. 11/561,063 (MT10407TK), Rejection-Non-Final dated Dec. 9, 2008.
USPTO Office Action regarding related U.S. Appl. No. 11/561,063 (MT10407TK), Notice of Allowance-Examiners Comments dated Apr. 27, 2009.
http://www.fujipoly.com/products/genProductLine.asp?ProductLine=Zebra.
http://images.google.com/images?hl=en&source=hp&q=zebra%20connectors&oq=&um=1&ie=UTF-8&sa=N&tab=wi.
http://www.j-n-s-ind.com.hk/siliconerubberconnector.htm.
U.S. Appl. No. 11/561,232, Notice of Allowance, Examiners Statement on Reason for Allowance, dated Nov. 25, 2009.
U.S. Appl. No. 12/510,369, Notice of Allowance, Examiner's Statement on Reason for Allowance, dated Sep. 21, 2009.
http://www.globalsources.com/gsol/l/Zebra-connector-manufacturers/b/2000000003844/3000000157657/21819.htm.
http://en.wikipedia.org/wiki/Elastomeric_connector.
http://commons.wikimedia.org/wikilFile:Zebra_connector.jpg.

* cited by examiner

METHOD OF PACKAGING A DEVICE HAVING A MULTI-CONTACT ELASTOMER CONNECTOR CONTACT AREA AND DEVICE THEREOF

CROSS-REFERENCE TO RELATED APPLICATION(S)

This application is related to the following four applications assigned to the assignee hereof, by the same inventors hereof, and filed on even date herewith:

1. U.S. patent application Ser. No. 11/561,241, titled METHOD OF PACKAGING A DEVICE USING A DIELECTRIC LAYER;
2. U.S. patent application Ser. No. 11/561,232, titled METHOD OF PACKAGING A DEVICE HAVING A TANGIBLE ELEMENT AND DEVICE THEREOF;
3. U.S. patent application Ser. No. 11/561,211, titled METHOD OF PACKAGING A DEVICE HAVING A KEYPAD SWITCH POINT; and
4. U.S. patent application Ser. No. 11/561,063, titled METHOD OF PACKAGING A SEMICONDUCTOR DEVICE AND A PREFABRICATED CONNECTOR.

FIELD OF THE INVENTION

This invention relates generally to packaging a device, and more specifically, to packaging a device having a multi-contact elastomer connector contact area.

BACKGROUND

Typically, devices are packaged for protection during operation. These packaged devices are placed on a printed circuit board (PCB) with other devices. The PCB with the devices is used in products, such as computers or cellular phones, and in many cases are coupled to external peripheral devices such as liquid crystal displays to provide additional functionality, such as numerical outputs. However, the addition of these external peripheral devices may further increase the size of the products. Since there is a desire to decrease the size of products, such as computers and cellular phones, there is a need to decrease the size of the PCB and the package device without sacrificing functionality, such as the functionality provided by the external peripherals. In addition, cost is a concern. Therefore, a need exists for a cost-effective packaging method that can increase functionality.

BRIEF DESCRIPTION OF THE DRAWINGS

The present invention is illustrated by way of example and is not limited by the accompanying figures, in which like references indicate similar elements. Skilled artisans appreciate that elements in the figures are illustrated for simplicity and clarity and have not necessarily been drawn to scale.

DETAILED DESCRIPTION OF THE DRAWINGS

A cost-effective packaging method that can increase functionality includes a tangible element (e.g., a contact or a microphone). The tangible element is protected by a wall during processing. The wall may or may not be removed and may b any wall, such as a cavity wall. The tangible element is coupled to a semiconductor die within the package. The tangible element may be exposed after processing is complete and the wall (or a portion thereof), if applicable, may be removed. The tangible element may be coupled to another element (e.g., a numerical display, such as an alpha-numerical or full graphical display) besides the semiconductor die within the package through a multi-contact elastomeric connector.

A multi-contact elastomeric connector (also referred to as a multi-contact elastomeric strip) is used to couple numerical displays, such as a liquid crystal display (LCD) to a semiconductor device. A multi-contact elastomeric connector includes alternating layers of an insulating elastomer and a conductive elastomer. In one embodiment, the insulating elastomer is a silicon rubber-based material and the conductive elastomer is the same material filled with conductive particles (e.g., metal particles or carbon granules). The insulating elastomer isolates each of the conductive elastomers from each other, while the conductive elastomer couples two contacts from two devices or parts together, as will better understood after further explanation. In one embodiment, each layer (insulating or conductive) is approximately 0.064 mm thick. The multi-contact elastomeric connector may include any number of alternating layers, such as 200 (100 of each type of layer) to 400 (200 of each type of layer) alternating layers per inch. The connector has a repeated pattern of the alternating layers that is similar to the pattern of a zebra's stripes. The ability to integrate a multi-contact elastomeric connector within a packaged device (where the packaged device may include one or more semiconductor devices, one or more discrete circuit elements, or combinations thereof) can result in smaller portable products, such as wrist watch size cellular handsets and other products that may benefit from an integrated multi-contact elastomeric connector. Thus, it is desirable for a semiconductor package to include a multi-contact elastomer connector contact area so that the semiconductor manufacturer or a purchaser of the semiconductor package can insert a multi-contact elastomer connector into the contact area, if desired.

Figure 1:
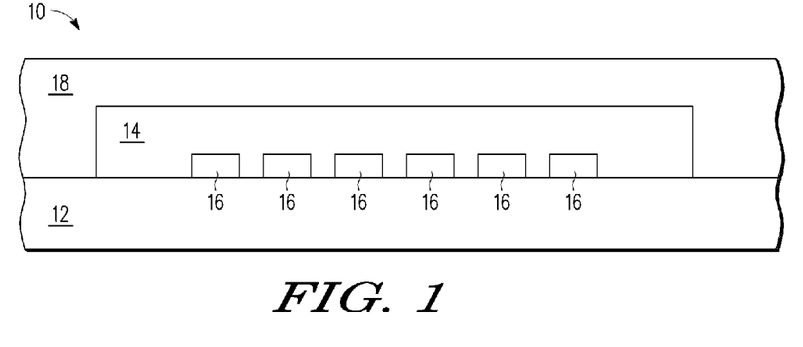
FIG. 1 illustrates a cross-section of a portion of a panel including a portion of an adhesive, a semiconductor device, and an encapsulating layer in accordance with an embodiment of the invention.

FIG. 1 illustrates a cross section of a portion of a panel 10 including a portion of an adhesive 12, a semiconductor device 14, and an encapsulating layer 18 in accordance with an embodiment. The adhesive 12, in one embodiment, is a tape. The panel 10, in one embodiment, includes a plurality of aggregated sites of devices, where FIG. 1 illustrates an aggregate site including at least one semiconductor device. Each aggregate site of panel 10 may be identical to each other or they may not all be identical to each other. Furthermore, each aggregate site may include one or more semiconductor devices, one or more discrete devices, or one or more of any other type of devices, or combinations thereof. At some point later in the process, as will be described below, panel 10 will be singulated such that each aggregated site of panel 10 will correspond to a single packaged device; thus, in the illustrated embodiment, the package will include the semiconductor device 14. The panel 10 may be formed by placing semiconductor devices or die that have passed testing requirements, such as electrical, mechanical, or both, (i.e., known good die), discrete devices, the like, or combinations of the above on the adhesive 12. The semiconductor device 14 includes contacts (e.g., pads or surface contacts) 16, which are exposed at a first side (i.e., a front side or a first major surface) of the semiconductor device 14. Note that in the illustrated embodiment, the first side or front side of the semiconductor device 14 corresponds to the side having the active circuitry of the device, where the contacts 16 which contact to the active circuitry are located at the first or front side. Also, note that the semiconductor device 14 can be referred to as a semiconductor die.

After the semiconductor device 14 is placed on the adhesive 12, the encapsulating layer 18 is formed over a second side (i.e. a back side or a second major surface), opposite the first side of the semiconductor device 14 in accordance with one embodiment. In one embodiment, the encapsulating layer 18 is a dielectric (or insulating) layer such as, for example, a spun-on polymer or a molding material that may be applied using any suitable process. Alternatively, the encapsulating layer 18 may be any commercially available encapsulant, such as, for example, an epoxy-based and heat curable encapsulant. Because the adhesive 12 is in contact with one side (e.g. the front side) of the semiconductor device 14 the encapsulating layer 18 is formed on the (five) sides of the semiconductor device 14. In the embodiment shown, the five sides of semiconductor device 14 that are in contact with the encapsulating layer 18 include all sides of the semiconductor device 14 except the side that has contacts 16. Hence, the encapsulating layer 18 is formed over and adjacent the sides of the semiconductor device 14.

Figure 2:
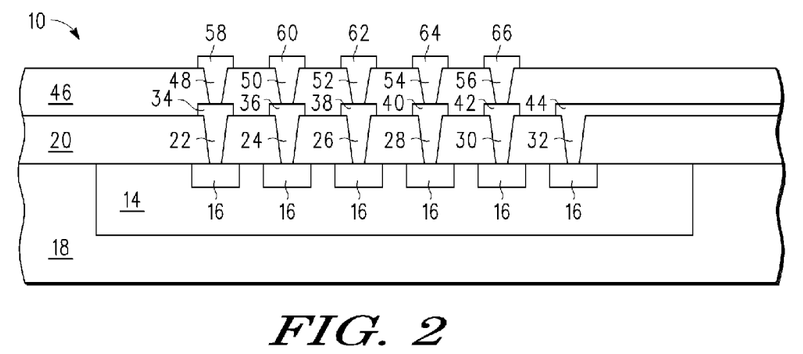
FIG. 2 illustrates the panel after removing the adhesive and forming conductive regions in accordance with an embodiment of the invention.

FIG. 2 illustrates the panel 10 after removing the adhesive 12 and forming conductive regions in accordance with one embodiment. The adhesive 12 can be removed using any process, such as heat (e.g., UV light), a solvent, the like or combinations of the above. After the adhesive 12 is removed, the panel 10 is flipped over so that the contacts 16 of the semiconductor device 14 are on top and exposed.

After forming removing the adhesive 12 and flipping over the panel 10, a first dielectric layer 20 is formed over the first sides (or first major surfaces) of the semiconductor device 14 in accordance with one embodiment. The first dielectric layer 20 may be a conventional spun-on polymer or any other suitable material formed by any suitable process, such as any suitable deposition process. In one embodiment, the first dielectric layer 20 may be approximately 20 microns thick of a spun-on polymer. Note that the first dielectric layer 20 is formed over the top sides of the semiconductor device 14. That is, the first dielectric layer 20 is formed over the side of the semiconductor device 14 having exposed contacts 16. After forming the first dielectric layer 20, via-holes are formed by patterning and etching the first dielectric layer 20 to expose at least a portion of each of the contacts 16. The via-holes are then filled with any conductive material, such as copper, to form vias 22, 24, 26, 28, 30 and 32. Therefore, note that vias refer to conductor-filled via-holes. The conductive material can be deposited using any suitable process (e.g., chemical vapor deposition (CVD), atomic layer deposition (ALD), plating, the like, and combinations of the above) to fill the via-holes and form a thick enough material over the first dielectric layer 20 for subsequent interconnects. The material that lies outside the vias 22, 24, 26, 28, 30, and 32 and over the first dielectric layer 20 may be patterned to form the interconnects, as needed, or contacts, which are a type of interconnect. As illustrated in FIG. 2, the via 32 is coupled to interconnect 44 that couples the via 32 and the underlying contact 16 to another device in a different portion of the panel 10, if applicable. Interconnects may electrically couple two vias, route signals within a layer, etc. Note that interconnects may travel in a direction that is in and out of the page. The remaining contacts 16, by way of example, have contacts 34, 36, 38, 40 and 42 formed over the vias 22, 24, 26, 28 and 30, respectively. A skilled artisan recognizes that the interconnect 44 and the contacts 34, 36, 38, 40 and 42 as illustrated in FIG. 2 are merely examples of the interconnects that can be formed.

After forming the contacts 34, 36, 28, 40 and 42 and the interconnect 44, a second dielectric layer 46 is formed over first dielectric layer 20 in accordance with one embodiment. The second dielectric layer 46 may be a spun-on polymer or another suitable material. The second dielectric layer 46 may be the same material or a different material than the first dielectric layer 20 and may or may not be formed by the same process as first dielectric layer 20. The second dielectric layer 46 is formed over the contacts 34, 36, 38, 40 and 42 and the interconnect 44 in the embodiment illustrated. In one embodiment, the second dielectric layer 46 is approximately 20 microns thick.

After forming the second dielectric layer 46, the vias 48, 50, 52, 54, and 56 and the contacts 58, 60, 62, 64, and 66 are formed in accordance with one embodiment, where the descriptions provided above for forming vias, and interconnects can be used to form these vias and interconnects as well. In one embodiment, the contacts 58, 60, 62, 64, and 66 have a surface that is above the second insulating layer 46. In one embodiment, the contacts 58, 60, 62, 64, and 66 are in a line. Note that contact 58 is coupled to the semiconductor device 14 through the vias 48 and 22 and contacts 34 and 16; the contact 60 is coupled to the semiconductor device 14 through the vias 50 and 24 and contacts 36 and 16; the contact 62 is coupled to the semiconductor device 14 through the vias 52 and 26 and the contacts 38 and 16; the contact 64 is coupled to the semiconductor device through vias 54 and 28 and the contacts 40 and 16; and the contact 66 is coupled to the semiconductor device through vias 56 and 30 and the contacts 42 and 16.

Figure 3:
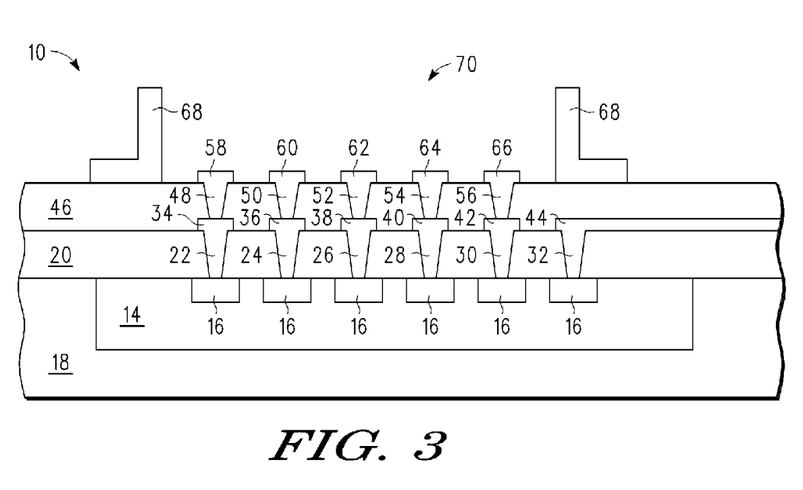
FIG. 3 illustrates the panel after forming a wall according to an embodiment of the invention.

FIG. 3 illustrates the panel 10 after forming a wall or barrier 68, such as a multi-contact elastomeric connector wall or barrier or a cavity wall or cavity barrier, according to one embodiment. In one embodiment, the wall 68 forms an area in which a tangible element is located and the wall 68 protects the device from subsequent processing. The tangible element may be a semiconductor die, a MEM (micro-electro mechanical) device, a sensor (e.g., a photosensor), a LED (light-emitting diode), a switch, a transducer, a sensor, a camera, a speaker, a microphone, the like, portions of the above (e.g., a contact of one of the above), or combinations of the above.) In the embodiments illustrated in FIGS. 3-11, the tangible elements are contacts 58, 60, 62, 64, or 66. In the embodiments illustrated in FIGS. 12-17, the tangible element may be a microphone. As will be understood after further explanation, the tangible element may be an element that has at least a portion that is desirably exposed. In one embodiment, the wall is a multi-contact elastomeric connector wall that is used to form an area to protect contacts from subsequent processes and define an area in which a multi-contact elastomeric connector is subsequently formed or placed within.

In FIG. 3 the wall 68 is formed over the second dielectric layer 46 and around the contacts 58, 60, 62, 64, and 66. The wall 68 has a first face, which has a sidewall with a first face towards the contacts 58, 60, 62, 64, and 66 and a second face away from the contacts 58, 60, 62, 64, and 66. As shown, the wall 68 is placed over the second dielectric layer 46 when the second dielectric layer 46 is sticky or tacky enough so that the wall 68 will adhere to the second dielectric layer 46. In the cross-section illustrated, the wall 68 is substantially L-shaped such that the portion of the wall 68 that is closest to the second dielectric layer 46 has a surface area that is greater than that of the opposite portion of the wall 68 and thus, in one embodiment the shape appears to be similar to that of the uppercase letter "L." In other words, the substantially L-shaped wall 68, in one embodiment, is in the shape of the uppercase letter "L" as opposed to the lowercase letter "l" where both the top and bottom have the same surface area. As shown, the portion of the wall 68 that has the lower portion of the uppercase letter "L" extends away from the contacts 58, 60, 62, 64, and 66 so that the wall 68 can be brought closer to the contacts 58 and 66 than if the lower portion of the uppercase letter "L" faced towards the contacts 58 and 66. The shape of the wall 68 can be any desired shape and skilled artisans appreciate that the shape of the wall 68 illustrated in FIG. 3 is merely an example. In addition, in other embodiments, the wall 68 may not have a larger surface area on the bottom than on the top; for example, the wall 68 may be the shape of the lowercase letter "l." As skilled artisan recognizes that in cross-sections taken at other portions of the wall 68 or in other embodiments, the cross-section may have a different shape, such as a substantially "U-shape" or a substantially "O-shape." Furthermore, in other embodiments an adhesive can be formed between the second dielectric layer 46 and the wall 68 to adhere the wall 68 to the second dielectric layer 46. In one embodiment, the adhesive can be a tape. In addition, the wall 68 may be angled relative to the second dielectric layer 46. In one embodiment, the wall 68 is angled away from the contacts 58, 60, 62, 64, and 66 so that the angle between the wall 68 and the second dielectric layer 46 is smaller on the side of the wall 68 that is opposite the contacts 58, 60, 62, 64, and 66. In other words, the larger angle is between the wall 68 and the second dielectric layer 46 is greater on the side of the wall 68 that is (laterally) adjacent the contacts 58, 60, 62, 64, and 66. This may be beneficial if the wall 68 is subsequently removed after forming an adjacent layer (e.g., a third dielectric layer). The wall 68 can be any suitable material, such as a plastic. In one embodiment, the wall 68 provides support to define a multi-contact elastomeric contact area 70 and maintain this area during subsequent processing. In one embodiment, the multi-contact elastomeric contact area 70 is rectangular and the sidewall of the area is adjacent to the contacts 58, 60, 62, 64, and 66. It is preferred that the wall 68 is a non-conductive material so that when the multi-contact elastomeric connector is subsequently inserted into the multi-contact elastomeric contact area 70, it is preferably not coupled to the multi-contact elastomeric connector wall 68 (although it could be.) However, the multi-contact elastomeric contact area 70 may not be coupled to the wall 68 (even if the wall 68 is conductive) if the insulating elastomer layer is in contact with the wall 68. The wall 68 preferably has a height that will be greater than the subsequently formed laterally adjacent layer (e.g., a supporting layer) so to prevent this laterally adjacent layer from being formed within the multi-contact elastomeric contact area 70. Although not illustrated, material may be formed in the multi-contact elastomeric contact area 70 to protect the contacts 58, 60, 62, 64, and 66 from being covered by the subsequently formed adjacent layer. The material chosen to protect the contacts 58, 60, 62, 64, and 66 can be any suitable material such as a gel (e.g., room temperature vulcanizing (RTV) silicone). This material may serve as a plug and be removed after further processing and before inserting the multi-contact elastomer connector.

Figure 4:
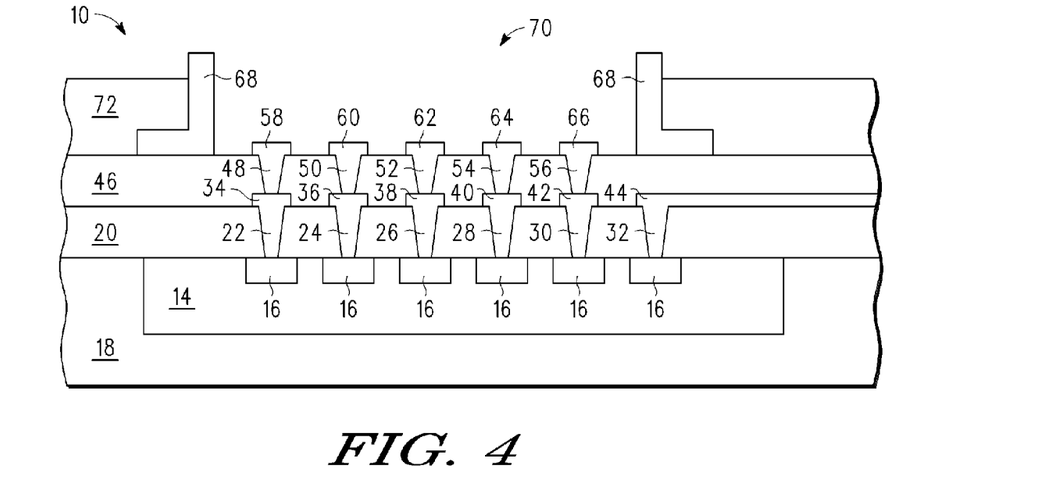
FIG. 4 illustrates the panel after forming a third dielectric layer laterally adjacent the wall in accordance with an embodiment of the invention.

FIG. 4 illustrates the panel 10 after forming a layer 72 laterally adjacent the walls, 68, but not between them, in accordance with an embodiment. In one embodiment, the layer 72 is a dielectric layer, and in one embodiment it is another type of material, such as a polymer. Since it is preferable that the layer 72 is a dielectric layer to avoid shorting, the description will refer to the layer as the third dielectric layer 72 although a skilled artisan understands that this is only one embodiment. The third dielectric layer 72 may be any suitable material, such as the materials used for the first dielectric layer 20 and the second dielectric layer 46, and formed by any suitable process, such as those used to form the first dielectric layer 20 and the second dielectric layer 46. However, the third dielectric layer 72 need not be the same material as or formed using the same processes as the first dielectric layer 20 or the second dielectric layer 46. In one embodiment, the third dielectric layer 72 is formed by depositing a liquid over the second dielectric layer 46 so that the liquid is adjacent the second face of the wall 68 and prevented from reaching the first fact of the wall 68. In one embodiment, the liquid includes an epoxy resin. The liquid may be of varying viscosity, density, and composition. Afterwards, the liquid is cured to complete formation of the supporting layer, which in this embodiment includes the third dielectric layer 72. When forming the third dielectric layer 72, the multi-contact elastomeric connector walls 68 (and a plug, if present) prevent the third dielectric layer 72 from being substantially formed within the multi-contact elastomeric contact area 70. (Some minimal amount of the third dielectric layer 72 may be formed in the multi-contact elastomeric contact area 70, but it is not substantially formed in the multi-contact elastomeric contact area 70 because any amount formed in the multi-contact elastomeric contact area 70 does not prevent the contacts 58, 60, 62, 64 and 66 from being coupled to the subsequently placed multi-contact elastomeric connector.) Again, the height of the wall 68 and the third dielectric layer 72 may be chosen so that no substantial amount of the third dielectric layer 72 is formed in the multi-contact elastomeric contact area 70. In one embodiment, the third dielectric layer is approximately 1.0 mm thick and the wall 68 is approximately 1.2 mm high for use with an multi-contact elastomeric connector 74 with a height of approximately 1.5 mm.

A semiconductor manufacturer may at this time singulate the panel 10 to form a packaged device. In addition, after singulation a semiconductor manufacturer may ship the package device to a customer who may then continue further processing. (However, additional processing not discussed but known to a skilled artisan may be performed before singulation such as the formation of solder bumps or other electrical contacts outside of the package.) If a RTV silicone (or another suitable material is used as a plug), the semiconductor manufacturer may ship the product with or without the RTV silicone (or other suitable material.) The RTV silicone (or other suitable material), if present, can protect the contacts 58, 60, 62, 64, and 66 during shipping. Thus, all references in the foregoing figures to the element 10 are to either the panel 10 or the semiconductor package 10 and these terms can be used interchangeably in these figures depending on whether or not singulation has already occurred.

Figure 5:
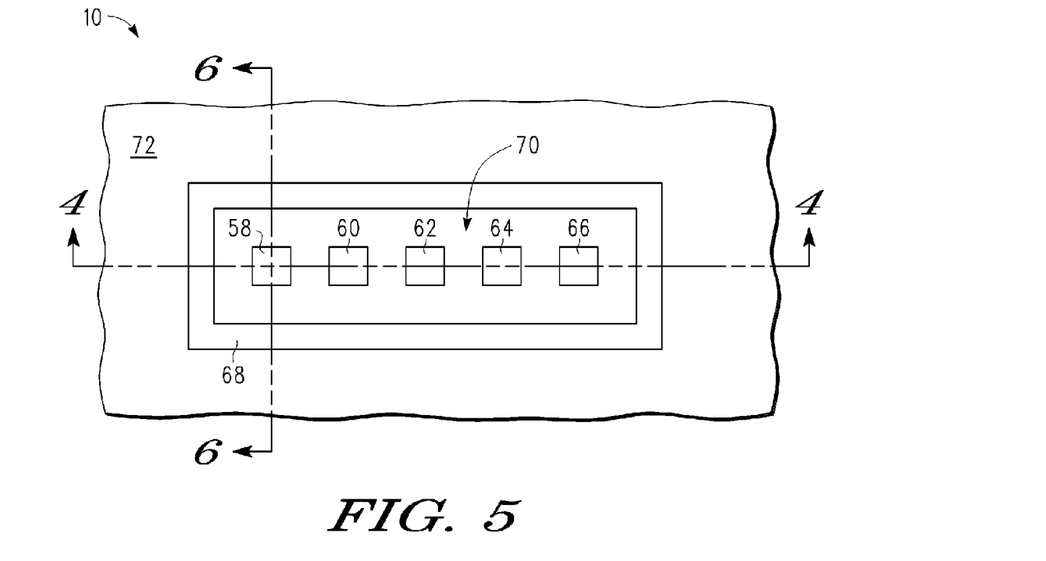
FIG. 5 illustrates a top view of the panel or semiconductor package of FIG. 4 in accordance with an embodiment of the invention.

FIG. 5 illustrates a top view of the panel or semiconductor package 10 of FIG. 4 in accordance with an embodiment. As illustrated, the multi-contact elastomeric connector wall 68 surrounds the contacts 58, 60, 62, 64, and 66 to create the multi-contact elastomeric contact area 70 that is substantially void of the third dielectric 72. As shown in FIG. 5, FIG. 4 is a cross-section along all of the contacts 58, 60, 62, 64, and 66 (lengthwise) and FIG. 6 is a cross-section along the width of the contact 58.

Figure 6:
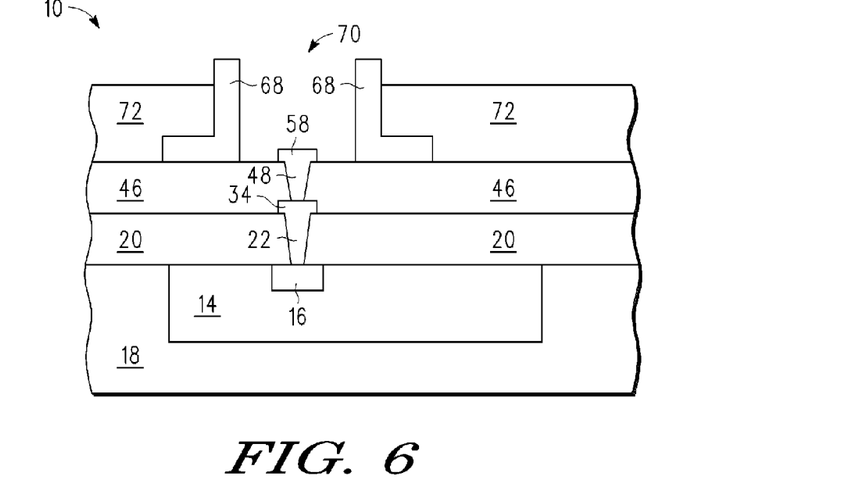
FIG. 6 illustrates a cross-section of the panel along the width of the contact after forming the third dielectric layer in accordance with an embodiment of the invention.

FIG. 6 illustrates a cross-section of the contact 58 after forming the third dielectric layer 72 in accordance with an embodiment. As shown, the multi-contact elastomeric wall 68 prevents the third dielectric layer 72 from being substantially formed in the multi-contact elastomeric contact area 70. Since in the embodiment illustrated, the multi-contact elastomeric connector is longer than it is wide, the multi-contact elastomeric walls 68 are spaced apart farther in FIG. 4 than in FIG. 6 and hence, the multi-contact elastomeric contact area 70 is longer than it is wide. However, a skilled artisan recognizes that the multi-contact elastomeric connector may have any shape and thus, the multi-contact contact area 70 may not be longer than it is wide.

Figure 7:
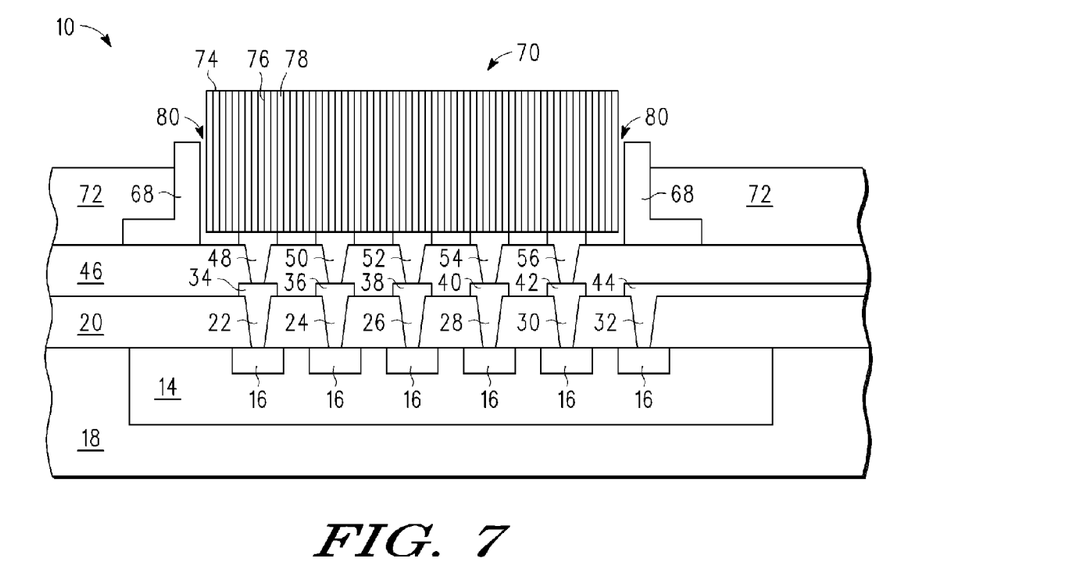
FIG. 7 illustrates the panel or the semiconductor package of FIG. 4 (along a length-wise cross-section of the contacts) after inserting a multi-contact elastomeric connector within the multi-contact elastomeric connector contact area in accordance with an embodiment of the invention.

FIG. 7 illustrates the panel 10 or the semiconductor package 10 of FIG. 4 after inserting a multi-contact elastomeric connector 74 within the multi-contact elastomeric connector contact area 70 in accordance with an embodiment. The multi-contact elastomeric connector 74 can be inserted by any means, such as manually or by machine. The multi-contact elastomeric connector 74 includes alternative layers of a conductive elastomer layer 76 and an insulating elastomer layer 78. The multi-contact elastomeric connector contact area 70 is greater in length than the multi-contact elastomeric connector 74 and hence gaps 80 are present between the multi-contact elastomeric connector 74 and the wall 68. Although two gaps 80 are illustrated in FIG. 7, there may be only one gap as the other side of the multi-contact elastomeric connector 74 may abut the wall 68 depending on how the multi-contact elastomeric connector 74 is placed in the multi-contact elastomeric connector contact area 70. Note that in the multi-contact elastomeric connector contact area 70, the multi-contact elastomeric connector 74 rests on the contacts 58, 60, 62, 64, and 66 and does not fill the gaps between each of these contacts 58, 60, 62, 64, and 66 in one embodiment. Also note that the multi-contact elastomeric connector 74 extends outside of the multi-contact elastomeric connector contact area 70. In other words, the multi-contact elastomeric connector 74 has a height that is greater than the wall 68 and the third dielectric layer 72. In one embodiment, the elastomeric connector 74 is 0.3 mm taller than the wall 68.

Figure 8:
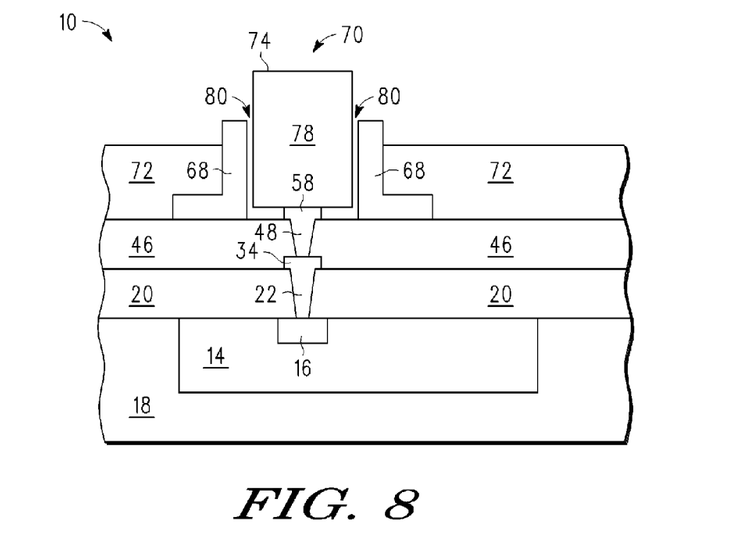
FIG. 8 illustrates the panel or the semiconductor package of FIG. 6 after inserting the multi-contact elastomeric connector into the multi-contact elastomeric connector contact area in accordance with an embodiment of the invention.

FIG. 8 illustrates the panel 10 or the semiconductor package 10 of FIG. 6 after inserting the multi-contact elastomeric connector 74 into the multi-contact elastomeric connector contact area 70 in accordance with an embodiment. The multi-contact elastomeric connector contact area 70 is larger in width than the multi-contact elastomeric connector 74 and hence gaps 80 are present between the multi-contact elastomeric connector 74 and the wall 68. Although two gaps 80 are illustrated in FIG. 8, there may be only one gap as the other side of the multi-contact elastomeric connector 74 may abut the wall 68 depending on how the multi-contact elastomeric connector 74 is placed in the multi-contact elastomeric connector contact area 70. As discussed above, the multi-contact elastomeric connector 74 lies on top of the contact 58 in one embodiment. Since the layers of the multi-contact elastomeric connector 74 are alternating layers of the conductive elastomer layer 76 and the insulating elastomer layer 78 like a sandwich, when the cross-section of the contact 58 is taken along its width, only one of the alternating layer is visible. For example, the insulating elastomer layer 78 is shown in FIG. 8.

Figure 9:
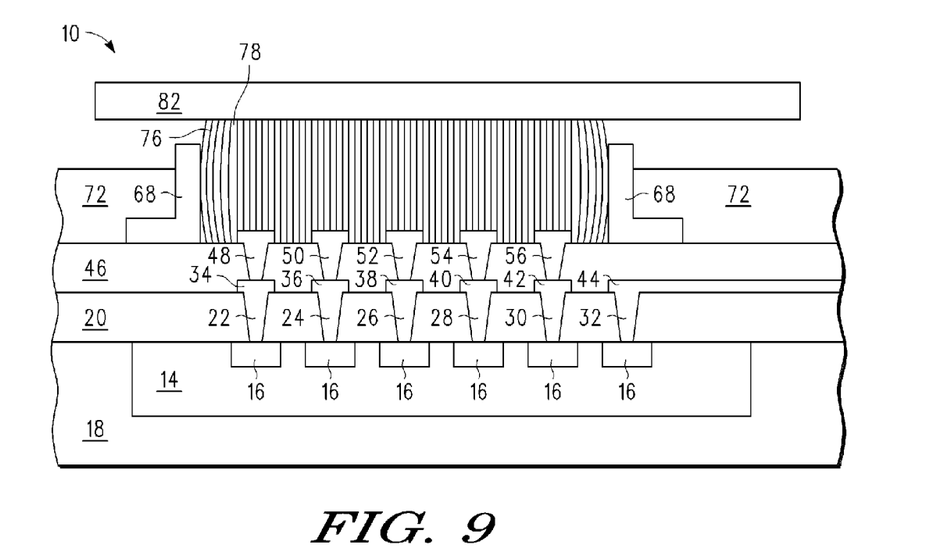
FIG. 9 illustrates the cross-section of the panel or semiconductor package of FIG. 7 after forming a numerical display and compressing the multi-contact elastomeric connector in accordance with an embodiment of the invention.

FIG. 9 illustrates the cross-section of the panel 10 or semiconductor package 10 of FIG. 7 after forming a numerical display 82 and compressing the multi-contact elastomeric connector 74 in accordance with an embodiment. A numerical display 82, such as a LCD, (or more specifically contacts of a numerical display 82) is placed on the panel 10 or the semiconductor package 10 in contact with the multi-contact elastomeric connector 74 and a compressive force is applied so that contacts (not shown) on the numerical display 82 are coupled to the semiconductor device 14 through the multi-contact elastomeric connector 74; the contacts 58, 60, 62, 64, and 66; the vias 48, 50, 52, 54, and 56; the contacts 34, 36, 38, 40 and 42; the vias 22, 24, 26, 28, 30 and 32; and the contacts 16. The compressive force can be applied by any means such as by hand or by machine. In one embodiment, the multi-contact elastomeric connector 74 is compressed approximately 5% to approximately 15% of its uncompressed height. In one embodiment, compressive force applied at approximately one pound per centimeter. When the compressive force is applied, the height of the multi-contact elastomeric connector 74 is decreased and the length and width of the multi-contact elastomeric connector 74 are increased. Depending on the size of the gaps 80, the multi-contact elastomeric connector 74 may increase in width and length enough so that the gaps 80 are no longer present. When the compressive force is applied to the multi-contact elastomeric connector 74, the multi-contact elastomeric connector 74 deforms, especially at its edges so that some of the elastomeric layers, as illustrated, are bent. Because there are so many layers of conductive elastomeric layers separated by the insulating elastomeric layers compared to the length of the contacts 58, 60, 62, 64, and 66, the deformation does not create any alignment issues and alignment in general is not an issue. Thus, the conductive elastomeric layers do not deform so much that one conductive elastomeric layer 76 couples two adjacent contacts. Because in some embodiments the contacts 58, 60, 62, 64, and 66 may be approximately 100 mills or as small as approximately ½ a millimeter and there may be anywhere from 200 to over 400 of the alternating layers per inch, alignment issues and the chance of coupling two contacts during deformation is not a concern. Note that after compressing the multi-contact elastomeric connector 74, portions of the multi-contact elastomeric connector 74 are located between each of the contacts 58, 60, 62, 64, and 66 in the embodiment illustrated. However, since the contacts 58, 60, 62, 64, and 66 are so thin it may not be apparent in reality that the multi-contact elastomeric connector 74 is between the contacts 58, 60, 62, 64, and 66, as it may not be apparent in FIG. 7 that the multi-contact elastomeric connector 74 sits over and not between the contacts 58, 60, 62, 64, and 66. The wall 68 serves to constrain the multi-contact elastomeric connector 74 so that it does not extend in length outside of the multi-contact elastomeric contact area 70. The multi-contact elastomeric contact area 70 has dimensions that provide the multi-contact elastomeric connector 74 with structural or mechanical support and prevent the multi-contact elastomeric connector 74 from twisting or bending so severely that it can no longer function as a connector or that it couples two contacts together.

Figure 10:
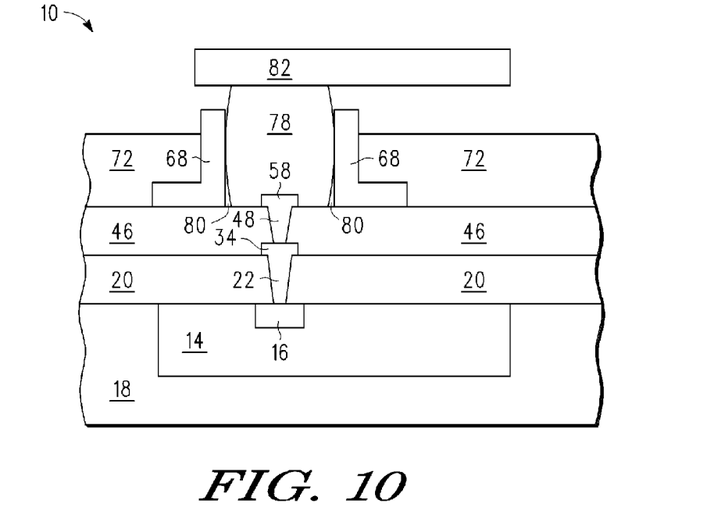
FIG. 10 illustrates the cross-section of the panel or semiconductor package of FIG. 8 after forming a numerical display and compressing the multi-contact elastomeric connector in accordance with an embodiment of the invention.

FIG. 10 illustrates the cross-section of the panel 10 or semiconductor package 10 of FIG. 8 after forming a numerical display 82 and compressing the multi-contact elastomeric connector 74 in accordance with an embodiment. After compression, the insulating elastomer layer 78 of the multi-contact elastomeric connector 74 is shown to abut the wall 68 and gaps 80 are decreased in volume at the bottom corner of the multi-contact elastomeric contact area 70. As discussed above, depending on dimensions in other embodiments portions of the gaps 80 may be present or the gaps 80 may be eliminated.

Figure 11:
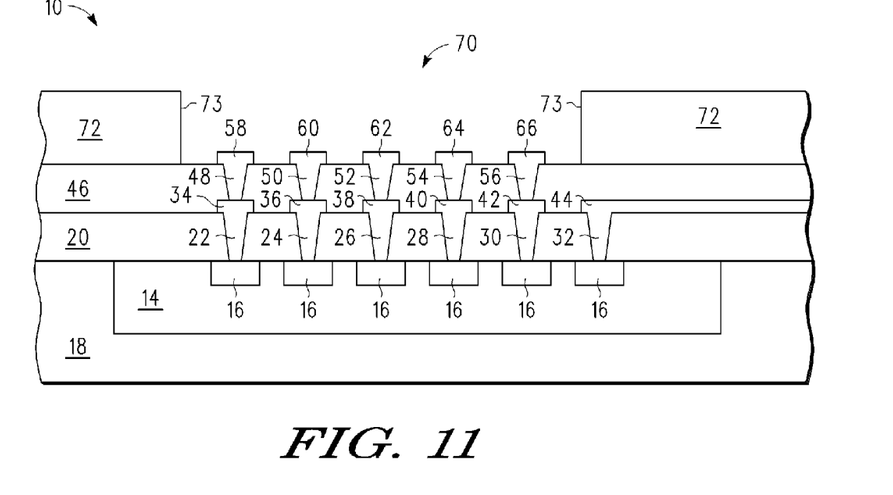
FIG. 11 illustrates the panel of FIG. 2 after forming the multi-contact elastomeric contact area in accordance with other embodiments of the invention.

FIG. 11 illustrates the panel 10 of FIG. 2 after forming the multi-contact elastomeric contact area 70 in accordance with other embodiments. In one embodiment, the multi-contact elastomeric contact area 70 is formed by etching the third dielectric layer 72. The etch can be a chemical etch, a laser etch, the like, or combination is of the above. In another embodiment, the multi-contact elastomeric contact area 70 is formed by using a mask and underfilling the mask with the third dielectric layer 72 or by using other means to form the third dielectric layer 72 around the mask; the mask is removed after forming the third dielectric layer 72. In this embodiment, a mold (or fixture) is applied over the second dielectric layer 46 that prevents the mold compound (or encapsulating material) from being applied to the contacts 58, 60, 62, 64, and 66 and a mold compound is applied to the mold. The mold compound may be of a low temperature or high temperature type and is cured to form the supporting layer. In addition, the mold is removed. In these embodiments, the third dielectric layer 72 alone forms the structural or mechanical support for the multi-contact elastomeric contact area 70. Sidewalls 73 of the third dielectric layer 72 will serve the same function as the wall 68. Furthermore, like in the other embodiment, the layer 72 can be another material besides a dielectric layer.

Figure 12:
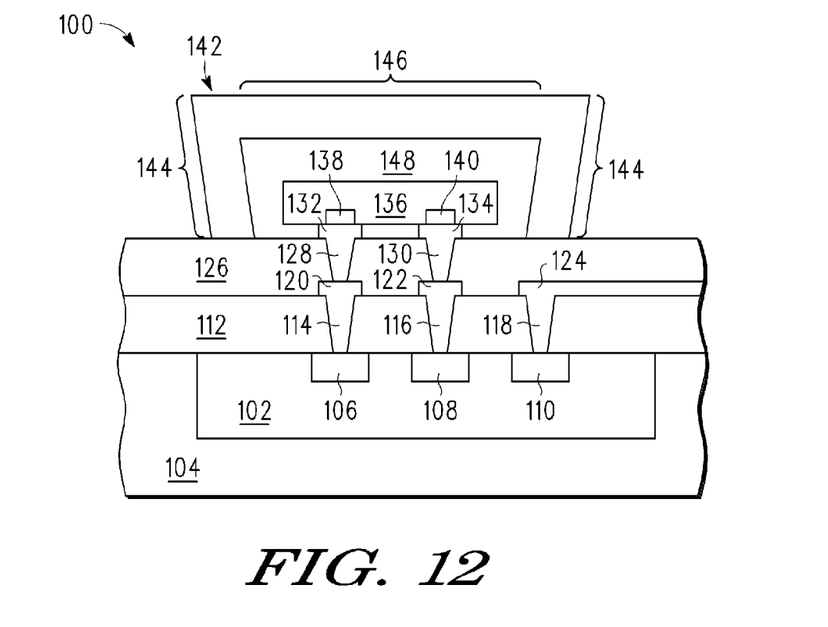
FIG. 12 illustrates a cross-section of a portion of a panel or a semiconductor package having a wall in accordance with an embodiment of the invention.

FIG. 12 illustrates a cross-section of a portion of a panel 100 or a semiconductor package 100 (as the panel 100 may have already been singulated) in accordance with an embodiment. The panel 100 includes an encapsulating layer 104 and a semiconductor die 102, which includes contacts 106, 108, and 110. A first dielectric layer 112 is formed over the semiconductor die 102. Vias 114, 116, and 118 are formed within the first dielectric layer 112. A second dielectric layer 126 is formed over the first dielectric layer 112. Vias 128 and 129 are formed within the second dielectric layer 126 and contacts 120 and 122 and interconnect 124 are formed over the second dielectric layer 126. Formed over the vias 128 and 130 are contacts 132 and 134. The contacts, interconnects, dielectric layers, encapsulating layer and semiconductor die are similar, if not identical, to the same layers in the previous figures and thus, can be the same materials and formed by the same processes.

A tangible element 136 is coupled to the contacts 132 and 134 through contacts 138 and 140 that are formed within the tangible element 136. The tangible element 136 may be any tangible element described above, such as a microphone. Note that if the contacts 132 and 134 include copper, it is desirable that the contacts 138 and 140 include copper for contact adhesion. In one embodiment, the tangible element 136 includes solder balls or leads that are used to physically couple the tangible element 136 to the contacts 138 and 140. After placing (manually or by hand) the tangible element 136 over the contacts 138 and 140, a reflow process is performed to physically adhere the tangible element 136 to the contacts 132 and 134. After coupling the tangible element 136 to the contacts 132 and 134, the tangible element 136 is coupled to the semiconductor die 102 through the contacts 132, 143, 120, 122, 106, 108, and 110; and the vias 128, 130, 114, 116, and 118. Next, a wall 142, which in the embodiment illustrated is a cavity wall, such as a prefabricated or preformed cavity wall, is placed over the tangible element 136. In one embodiment, the cavity wall 142 surrounds at least a portion of the tangible element 136 and the cavity wall 142 has a first face toward the tangible element 136 and a second face away from the tangible element 136. The cavity wall 142 can be any material, such as a ceramic, a metal, a plastic, a semiconductor material (e.g., silicon), the like, or combinations of the above. In the embodiment illustrated, the cavity wall 142 includes substantially vertical portions or side portions 144 and a substantially horizontal portion or top portion 146. The substantially vertical portions 144 each have an interior sidewall that is adjacent the tangible element 136 and an exterior sidewall. The substantially vertical portions 144 may be approximately perpendicular to the dielectric layer 126 or may be at an angle relative to the dielectric layer 126. In one embodiment, the substantially vertical portions 144 are angled away from the tangible element 136 so that the smaller angle between the substantially vertical portions 144 of the cavity wall 142 and the dielectric layer 126 is smaller on the sidewall of the substantially vertical portions 144 of the cavity wall 142 that are opposite the tangible element 136 (i.e., not laterally adjacent the tangible element 136 or are the exterior side of the cavity wall 142.) In other words, the larger angle is between the substantially vertical portions 144 of the cavity wall 142 and the dielectric layer 126 is greater on the sidewall of the substantially vertical portions 144 that are adjacent the tangible element 136. As a result of forming the cavity wall 142 over the tangible element 136, a gap (or cavity) 148 is formed around the tangible element 136. As will be better understood after further discussion, the cavity wall 68 protects the tangible element 136 during subsequent processing. In other words, the cavity wall 68 protects the tangible element 136 from a conductive (e.g., metal) layer or other layers. Thus, the wall 68 prevents a conductive layer or other layers from being formed in the gap 148 and in contact with the tangible element 136.

Figure 13:
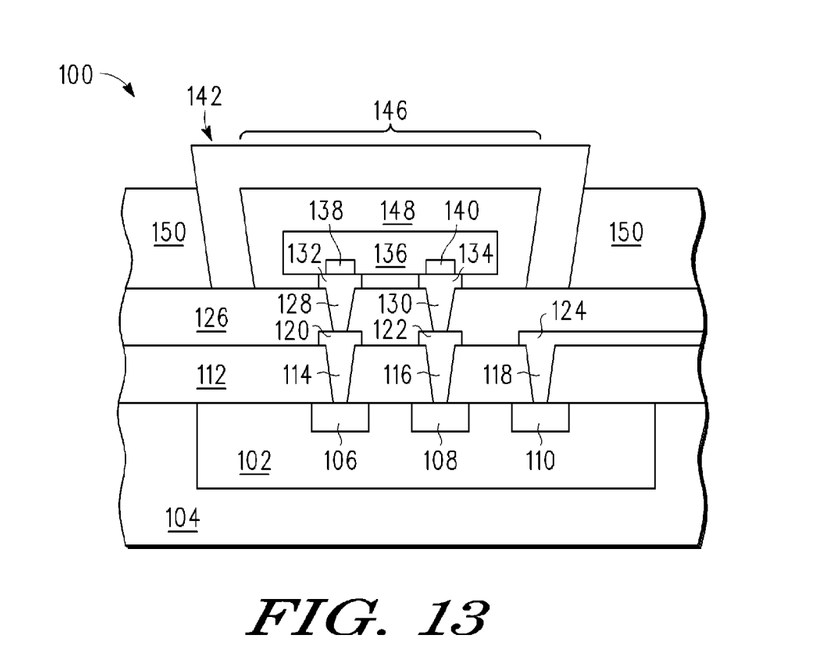
FIG. 13 illustrates the panel or semiconductor package of FIG. 12 after forming the supporting layer in accordance with an embodiment of the invention.

FIG. 13 illustrates the panel 100 or semiconductor package 100 of FIG. 12 after forming the supporting layer 150 in accordance with an embodiment. The supporting layer 150 can be a any suitable material, such as a dielectric layer, as previously discussed above. The substantially vertical portions 144 of the cavity wall 142 prevent the supporting layer 150 from being formed in the gap 148. Thus, the supporting layer 150 is not in contact with the tangible element 136. Similarly, the substantially horizontal portion 146 may prevent the supporting layer 150 from being formed in the gap 148. However, as will be shown below, the substantially horizontal portion 146 may not be needed to protect the tangible element 136 from the supporting layer 150.

Figure 14:
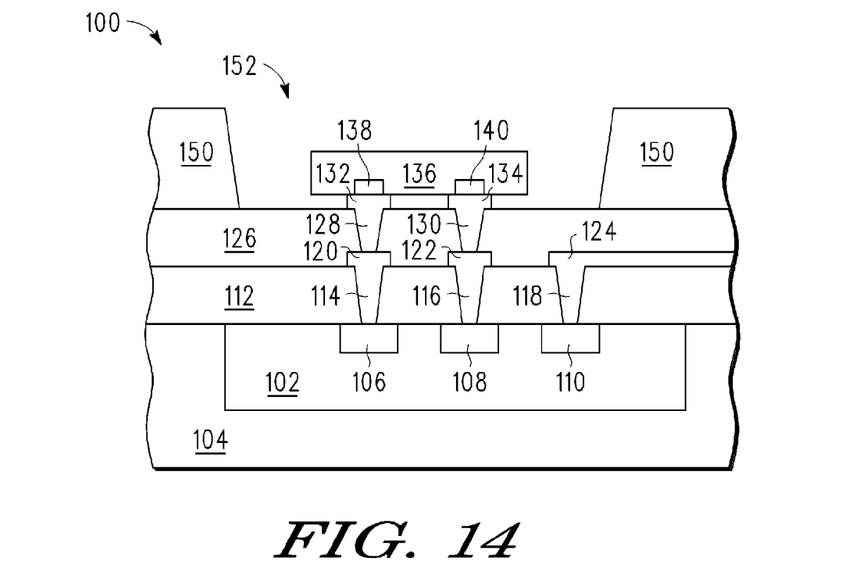
FIG. 14 illustrates the panel or semiconductor package of FIG. 13 after removing the cavity wall to form the opening in accordance with an embodiment of the invention.

FIG. 14 illustrates the panel 100 of semiconductor package 100 of FIG. 13 after removing the cavity wall 142 to form the opening 152 in accordance with an embodiment. To remove the cavity wall 142, a vacuum may be applied to the substantially horizontal portion 146 of the cavity wall 142 and then a force is applied to remove the cavity wall 142 from between the supporting layer 150. As described above, it may be desirable to have the substantially vertical walls 144 of the cavity wall 142 tilted or at an angle with respect to the dielectric layer 126 to aid in the removal process. While the substantially horizontal portion 146 may not be used to prevent the supporting layer 150 from being formed in contact with the tangible element 136, the substantially horizontal portion 146 may be used to remove the cavity wall 142. Any other suitable process may be used to remove the cavity wall 142. However, in one embodiment, the cavity wall 142 may not be removed at this time. Instead, singulation may occur (if it has not previously occurred) and the semiconductor package 100 with the cavity wall 142 may be shipped to a customer. The customer may then remove the cavity wall 142. Regardless of when the cavity wall 142 is removed, the cavity wall 142 is removed in some embodiments to expose the tangible element 136 by forming the opening 152. In one embodiment, the opening 152 is a region extending (at least) from the top surface of the supporting layer 150 to the (at least a portion of) the tangible element that is laterally surrounded by the supporting layer 150. In some embodiments, it is desirable to expose the tangible element 136 so that the tangible element 136 can perform its function. For example, if the tangible element 136 is a microphone, the cavity wall 142 is removed so that the microphone can receive sound waves and convert the sound waves and transmit them to the semiconductor die 102. In the embodiment illustrated, the opening 152 has sidewalls that are tilted outwards so that the top of the opening is larger than the bottom. The tilting outwards of the sidewalls of the opening 152 may allow for the tangible element 136 to better receive a signal (e.g., the microphone may be able to receive more sound waves.) However, a skilled artisan recognizes that the sidewalls of the opening 152 can have any angle and be any shape. For example, the sidewalls may be substantially perpendicular to the dielectric layer 126 and from a top view may form any shape, such as a square, circle, rectangle, or the like.

Figure 15:
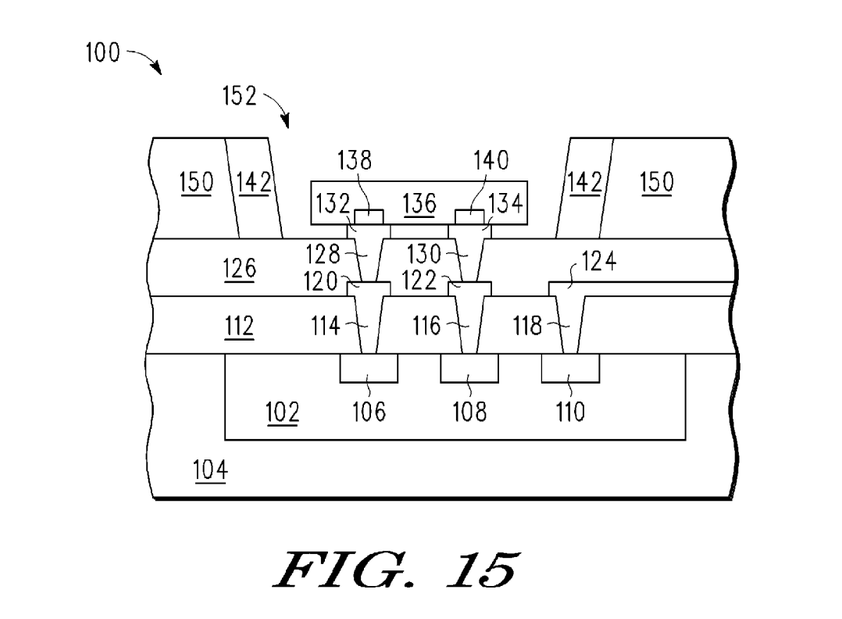
FIG. 15 illustrates a cross-section of the panel or the semiconductor package with a portion of or another cavity wall in accordance with an embodiment of the invention.

FIG. 15 illustrates a cross-section of the panel 100 or the semiconductor package 100 with a portion of the or a different cavity wall 142 in accordance with other embodiments. The cavity wall 142 in FIG. 15 includes only the substantially vertical portions and does not include the substantially horizontal portion of the cavity wall of FIGS. 12 and 13 and thus, can be a portion of a cavity wall or a different cavity wall. In one embodiment, the substantially horizontal portion was never present. In another embodiment, the substantially horizontal portion was removed. Thus, at least a portion of the top portion of the cavity wall was removed or never present so as to expose the tangible element 136. The portion removed can be removed by any process, such as by sawing, laser cutting, and grinding. In this embodiment, the semiconductor manufacturer before shipping or the customer may never remove the cavity wall 142 since the tangible element 136 is exposed even when the cavity wall 142 is present. Hence, the tangible element 136 (or portion thereof) may remain even when the tangible element 136 is being used by a consumer for its intended purpose either by using a cavity wall that exposes the tangible element or a cavity wall where portions of it are removed to expose the tangible s. If the cavity wall is to remain over the tangible element and it has a substantially horizontal portion that protrudes above the surface of the top most layer (e.g., dielectric layer 126) the surface of the top most layer may be lapped planar to open up the cavity wall and remove at least a portion of the substantially horizontal portion. If the cavity wall remains over the tangible element and it is even with or below the top most layer to be formed the cavity can be opened using a laser abatement process or other suitable process. As illustrated in FIG. 15, if the supporting layer 150 has a thickness that is equal to or less than the vertical height of the cavity wall 142 then the supporting layer 150 probably will not be formed within the opening 152 and thus, the substantially horizontal portion of the cavity wall 142 is not needed to protect the tangible element 136. (The vertical height of the cavity wall 142 is the height of the cavity wall 142 from the dielectric layer 126 to the top most portion of the cavity wall 142, not the length of the sidewall since the vertical height may be less than the length of the sidewall if the cavity wall 142 is at an angle other than ninety degrees with respect to the dielectric layer 126.)

The tangible element 136 illustrated in FIGS. 12-15 is formed over the semiconductor die 102. Thus, in some embodiments the tangible element 136 is located in a different level than the semiconductor die 102. A skilled artisan recognizes that the tangible element 136 can also be located under the semiconductor die 102. Regardless of whether the tangible element 136 is over or under the semiconductor die 102, it is coupled to the semiconductor die 102 (e.g., through the contacts 132, 134, 120, 122, 124, 138, 140, 106, 108, and 110 and the vias 12, 130, 114, 116, and 118.) In another embodiment, the tangible element is in the same level as the semiconductor die. In some embodiments, the tangible element is laterally adjacent the semiconductor die to which it is coupled.

Figure 16:
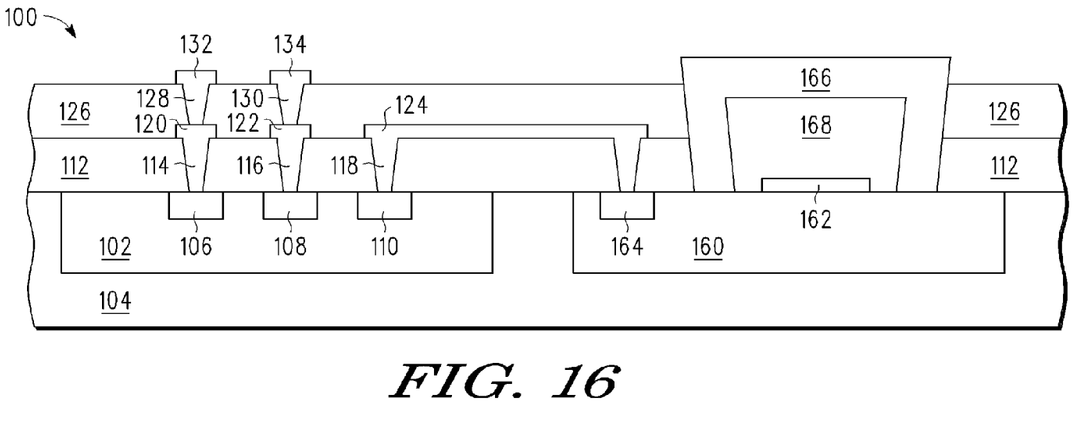
FIG. 16 illustrates a cross-section of the panel or the semiconductor package having a semiconductor die and a wall over a tangible element, which is coupled to the semiconductor die, in the same layer and adjacent each other in accordance with an embodiment of the invention.

FIG. 16 illustrates a cross-section of the panel 100 or the semiconductor package 100 having a semiconductor die 102 and a tangible element 160, which is coupled to the semiconductor die 102, in the same layer and adjacent each other in accordance with an embodiment. In FIGS. 12-15, the interconnect 124 was shown to be coupled to another element that was not shown in the figures, but in FIG. 16 the interconnect is coupled to the tangible element 160 through the contacts 110 and 164 and the component 160. The component 160 may be another semiconductor die and the tangible element may be a microphone or LED, for example. The cavity wall 166 includes substantially vertical portions and a substantially horizontal portion, although the substantially horizontal portion may not be present, as previously discussed. In addition, the substantially vertical portions are shown as being at an angle with respect to the component 160, but may be at any angle including substantially perpendicular to the component 160, as previously discussed. The cavity wall 166 is placed over the component 160 using any process previously discussed, prior to forming the dielectric 112, the vias 114, 116 and 118, the dielectric 126, the interconnect 124, the contacts 120 and 122, the vias 128 and 130, and the contacts 132 and 134. In this embodiment, the cavity wall 166 protects the tangible element 162 from forming the dielectric 112, 126 or conductive layers used to form the conductive regions 114, 116, 118, 120, 122, 124, 128, 130, 132 and 134 in contact with the tangible element 162. Although the cavity wall 166 may be any material, it is desirable that it is a material (e.g., plastic) from which the material used to form the conductive regions (e.g., copper) can be removed. When forming the conductive layer that is later patterned to form the contacts 120, 122, 132, and 134, and the interconnect 124, the conductive layer may be formed over the substantially horizontal portion of the cavity wall 166 and this portion of the conductive layer should be removed.

Figure 17:
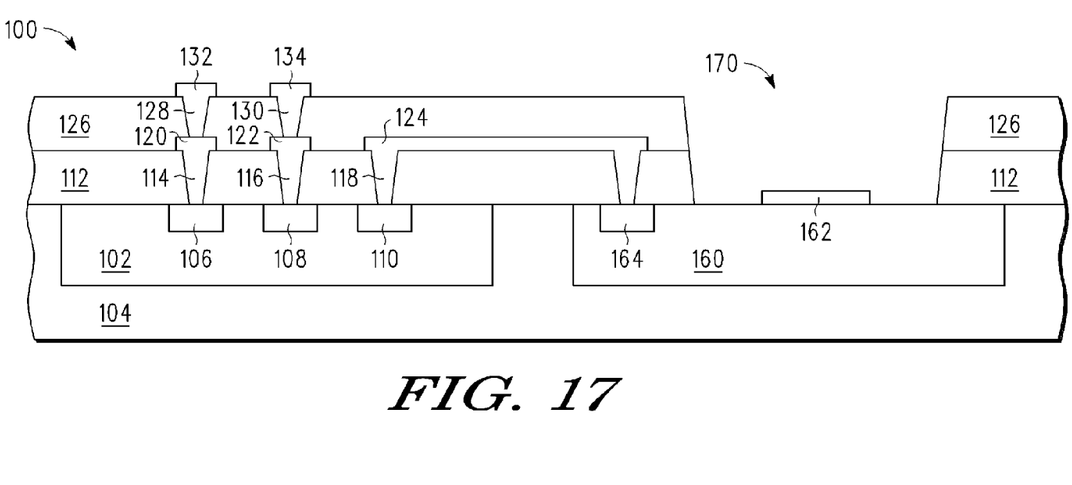
FIG. 17 illustrates the panel or the semiconductor package of FIG. 16 after removing the wall in one embodiment of the invention.

FIG. 17 illustrates the panel 100 or the semiconductor package 100 of FIG. 16 after removing the cavity wall 166 in one embodiment. The cavity wall 166 can be removed using any process previously described for removing the cavity wall in FIG. 14. By removing the cavity wall 144, an opening 170 is formed. The opening 170 exposes at least the tangible element 162; it also may expose other portions of the component that are adjacent the tangible element 162 (e.g., additional portions of the component 160), as shown in FIG. 17. Further processing may be performed afterwards. For example, solder balls or another element may be coupled to the contacts 132 and 134.

Therefore, it can now be understood how to form a supporting layer over a dielectric layer and leaving an opening over a tangible element (e.g., contacts) wherein the opening (e.g., the multi-contact elastomeric connector contact area 70) has a sidewall (e.g., sidewall 73 in one embodiment) surrounding the tangible element (e.g., contacts 58, 60, 62, 64, and 66). The supporting structure can be a supporting layer of material (e.g., the third dielectric layer 72), a wall (e.g., the wall 68), a plug, or another similar structure, or combinations of the above. In one embodiment, the sidewall (whether it be the sidewall 73 or a sidewall of the wall 68, for example) is for receiving the multi-contact elastomeric connector 74. In one embodiment, the wall 68 is used to protect the tangible element during subsequent processing and is later removed to expose the tangible element. In one embodiment, while the wall protects the tangible element from subsequent processing it is not later removed.

It should also be understood that a multi-contact elastomeric connector can be an interface and interconnect between a semiconductor die within a semiconductor package and an external component. In one embodiment, a cavity is formed and a removable plug is used to protect contacts. The multi-contact elastomeric connector, the tangible element, or both are formed over the front side of the semiconductor die 14 in the above figures, but a skilled artisan recognizes that the multi-contact elastomer connector, tangible element, or both can be formed on the bottom side of the semiconductor die 14 as well or in the alternative. Also, in other embodiments, the semiconductor device 14 may also include contacts on the back side of the device, opposite the front sides where contacts 16 are located.

By now it should be appreciated that there has been provided a low cost method for fabricating and embedding a package having a multi-contact elastomeric contact area and a multi-contact elastomeric connectors using a build-up technology for creating a packaged device of an exposed element. The resulting package may be a redistributed chip package (RCP) because the interconnects are routed or redistributed among one or more layers to minimize the area of the package. No wirebonding or traditional substrate (leadframe or package substrate) is needed to form a RCP. This increases yield and decreases cost.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, advantages, solutions to problems, and any element(s) that may cause any benefit, advantage, or solution to occur or become more pronounced are not to be construed as a critical, required, or essential feature or element of any or all the claims. The terms "a" or "an", as used herein, are defined as one or more than one even if other elements are clearly stated as being one or more in the claims or specification. The term "plurality", as used herein, is defined as two or more than two. The term another, as used herein, is defined as at least a second or more. The term "coupled", as used herein, is defined as connected, although not necessarily directly, and not necessarily mechanically. Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

What is claimed is:

1. A method of forming a packaged device having a semiconductor device having a first major surface and a second major surface, comprising:
    forming an encapsulating layer over the second major surface of the semiconductor device and around sides of the semiconductor device and leaving the first major surface of the first semiconductor device exposed,
    forming a first insulating layer over the first major surface;
    forming a plurality of vias in the first insulating layer;
    forming a plurality of contacts to the semiconductor device through the first plurality of vias, wherein each of the plurality of contacts has a surface above the first insulating layer and the surfaces of the plurality of contacts are in a line; and
    forming a supporting layer over the first insulating layer leaving an opening over the first plurality of contacts wherein the opening has a sidewall surrounding the plurality of contacts, the opening is rectangular, and the sidewall is adjacent to the plurality of contacts.

2. The method of claim 1, wherein the step of forming the supporting layer is further characterized by the sidewall being for receiving a multi-contact elastomeric connector.

3. The method of claim 1, wherein the step of forming the supporting layer comprises:
    placing a connector wall over the first insulating layer and around the plurality of contacts having a first face toward the plurality of contacts and a second face away from the plurality of contacts, wherein the first face comprises the sidewall; and
    depositing a liquid, after the step of placing the connector wall, over the first insulating layer so that liquid is adjacent to the second face and prevented from reaching the first face; and
    curing the liquid for completing formation of the supporting layer.

4. The method of claim 1, wherein the step of forming the supporting layer comprises:
    forming a polymer-based dielectric layer over the first insulating layer; and
    etching the opening in the polymer-based dielectric layer.

5. The method of claim 1, wherein the step of forming the supporting layer comprises:
applying a mold over the first insulating layer that prevents mold compound from being applied to the plurality of contacts;
applying the mold compound to the mold; and
curing the mold compound to form the supporting layer.

6. The method of claim 1, further comprising filling the opening with a gel.

7. The method of claim 3, wherein the step of depositing the liquid is further characterized by the liquid comprising an epoxy resin.

8. The method of claim 7, wherein the step of placing the connector wall is further characterized by the connector wall comprising plastic.

9. A packaged semiconductor device comprising
a semiconductor device having a first major surface and a second major surface;
an encapsulant over the second major surface and around sides of the semiconductor device,
a first insulating layer over the first major surface;
a plurality of vias in the first insulating layer;
a plurality of contacts to the semiconductor device through the first plurality of vias, wherein each of the plurality of contacts has a surface above the first insulating layer and the plurality of contacts are in a line; and
a supporting layer over the first insulating layer having an opening over the first plurality of contacts wherein the opening has a sidewall surrounding the plurality of contacts, the opening is rectangular, and the sidewall is adjacent to the plurality of contacts.

10. The packaged semiconductor device of claim 9, wherein the sidewall comprises means for receiving a multi-contact elastomeric connector.

11. The packaged semiconductor device of claim 9, further comprising a connector wall over the first insulating layer and around the plurality of contacts having a first face toward the plurality of contacts and a second face away from the plurality of connectors, wherein the first face comprises the sidewall.

12. The packaged semiconductor device of claim 11, wherein the plurality of contacts make contact to surface contacts on the first surface of the semiconductor device.

13. A method of forming a packaged device having a semiconductor device having a first major surface and a second major surface, comprising:

forming an encapsulating layer over the second major surface of the semiconductor device and around sides of the semiconductor device and leaving the first major surface of the first semiconductor device exposed;
forming a first insulating layer over the first major surface;
forming a plurality of vias in the first insulating layer;
forming a plurality of contacts to the semiconductor device through the first plurality of vias, wherein each of the plurality of contacts has a surface above the first insulating layer; and
forming a supporting layer over the first insulating layer leaving an opening over the first plurality of contacts wherein the opening has a sidewall means for receiving a multi-contact elastomeric connector, the opening is rectangular, the sidewall is adjacent to the plurality of contacts, and the plurality of contacts are in a line.

14. The method of claim 13, wherein the step of forming the supporting layer comprises:
placing a connector wall over the first insulating layer and around the plurality of contacts having a first face toward the plurality of contacts and a second face away from the plurality of connectors, wherein the first face comprises the sidewall;
depositing a liquid, after the step of placing the connector wall, over the first insulating layer so that liquid is adjacent to the second face and prevented from reaching the first face; and
curing the liquid for completing formation of the supporting layer.

15. The method of claim 13, wherein the step of forming the supporting layer comprises:
forming a second insulating layer over the first insulating layer; and
etching the opening in the second insulating layer.

16. The method of claim 13, wherein the step of forming the supporting layer comprises:
applying a mold over the first insulating layer that prevents mold compound from being applied to the plurality of contacts; and
applying the mold compound to the mold; and
curing the mold compound to form the supporting layer.

* * * * *